(12) United States Patent
Kobayashi et al.

(10) Patent No.: US 6,201,684 B1
(45) Date of Patent: Mar. 13, 2001

(54) CAPACITOR, FORMED OF A DIELECTRIC BODY HAVING A HIGH DIELECTRIC CONSTANT

(75) Inventors: Tsuyoshi Kobayashi; Tsuyoshi Shibamoto, both of Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/270,518

(22) Filed: Mar. 17, 1999

Related U.S. Application Data

(62) Division of application No. 08/907,915, filed on Aug. 11, 1997, now Pat. No. 5,903,429, which is a continuation of application No. 08/615,435, filed on Mar. 14, 1996, now abandoned.

(30) Foreign Application Priority Data

Mar. 14, 1995 (JP) .................................................. 7-53932

(51) Int. Cl.[7] ............................................... H01G 4/06
(52) U.S. Cl. ................................. 361/311; 361/321.5
(58) Field of Search ............................. 361/275.4, 321.1, 361/321.2, 321.4, 311–313, 306.3; 29/25.42; 438/430

(56) References Cited

U.S. PATENT DOCUMENTS

| | | |
|---|---|---|
| 3,118,095 | 1/1964 | Baron et al. . |
| 3,930,304 | 1/1976 | Keller et al. ............................ 29/574 |
| 4,543,171 | 9/1985 | Firester et al. ..................... 204/129.3 |
| 4,680,670 | 7/1987 | Chan .................................... 361/275 |
| 4,720,767 | 1/1988 | Chan et al. ........................... 361/275 |
| 4,749,454 | 6/1988 | Arya et al. ........................ 204/129.3 |
| 4,757,423 | 7/1988 | Franklin ............................... 361/275 |
| 4,806,496 | 2/1989 | Suzuki et al. . |
| 4,894,746 | 1/1990 | Mori et al. ........................... 361/275 |
| 5,035,488 | 7/1991 | Kobayashi .......................... 350/333 |
| 5,099,388 | 3/1992 | Ogawa et al. ....................... 361/321 |
| 5,290,986 | 3/1994 | Colon et al. ......................... 219/770 |
| 5,328,756 | 7/1994 | Wright et al. ........................ 428/220 |
| 5,521,332 | 5/1996 | Shikata et al. ..................... 174/52.4 |
| 5,545,598 | 8/1996 | Ogawa et al. ....................... 501/127 |

FOREIGN PATENT DOCUMENTS

| | | |
|---|---|---|
| 59-108397 | 6/1984 | (JP) . |
| 1-69007 | 3/1989 | (JP) . |
| 1-69008 | 3/1989 | (JP) . |
| 3-087091 | 4/1991 | (JP) . |

*Primary Examiner*—Anthony Dinkins
(74) *Attorney, Agent, or Firm*—Staas & Halsey LLP

(57) ABSTRACT

A method for producing a capacitor includes: a dielectric body composed of basic alumina powder mixed with tungsten powder, interposed between a pair of electrodes disposed opposite to each other. The method includes the steps of: after a conductive alumina ceramic body has been formed by mixing the tungsten powder with the alumina powder, providing a pair of electrodes while interposing the conductive alumina ceramic body therebetween, and intermittently applying an electric current or voltage to the electrodes, high enough to break conductive paths formed in the conductive alumina ceramic body by the tungsten powder, so that the conductive ceramic body is converted to the dielectric body.

6 Claims, 4 Drawing Sheets

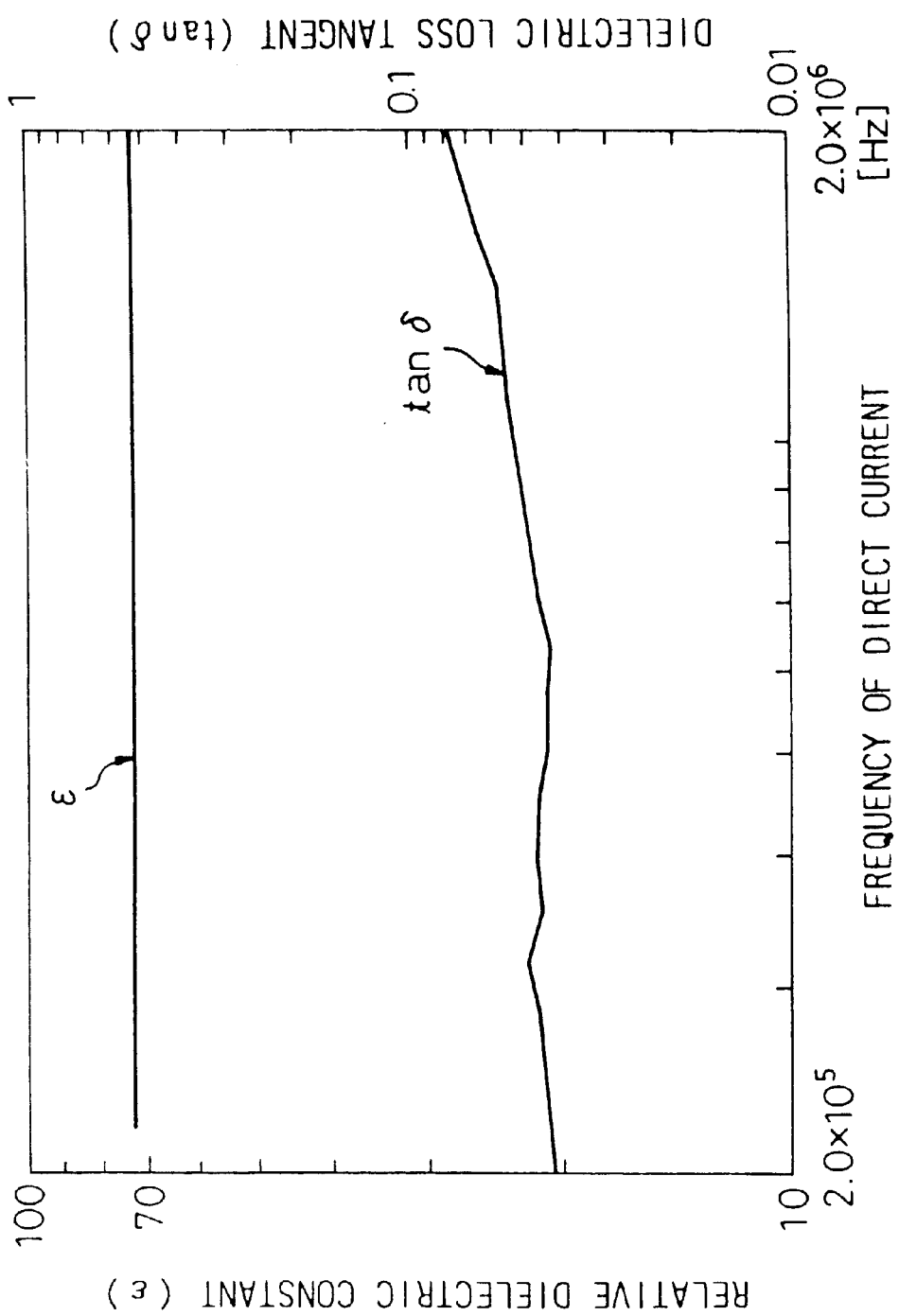

CAPACITOR, FORMED OF A DIELECTRIC BODY HAVING A HIGH DIELECTRIC CONSTANT

This application is a divisional of application Ser. No. 08/907,915, filed Aug. 11, 1997, now U.S. Pat. No. 5,903,429, which is a continuation of application Ser. No. 08/615,435, filed Mar. 14, 1996, now abandoned.

BACKGROUND OF THE INVENTION

1. Field of the Invention

The present invention relates to a capacitor, a method for producing the same and method for producing a dielectric body. Particularly, this invention relates to a capacitor wherein a dielectric body formed of a basic dielectric substance mixed with conductive substance is interposed between a pair of electrodes, a method for producing the same and a method for producing a dielectric body obtained by mixing conductive substance in a basic dielectric substance.

2. Description of the Related Art

A capacitance of a capacitor is given by the following formula:

$$C = (\epsilon_0)(\epsilon_1)(S/d)$$

wherein C: capacitance of capacitor
$\epsilon_0$: relative dielectric constant in vacuum
$\epsilon_1$: relative dielectric constant of dielectric body
S: area of dielectric body
d: thickness of dielectric body To increase the capacitance (C) of the capacitor, it is necessary to enlarge the area (S) of the dielectric body or reduce the thickness (d) of the dielectric body.

In Japanese Unexamined Patent Publication (Kokai) No. 3-87091, a method for producing an alumina ceramic circuit board is proposed wherein a green sheet formed of aluminum powder as a ceramic material added with molybdenum powder and/or tungsten powder in a range between 5 and 50% by weight is fired at a predetermined temperature.

According to the method disclosed in this Patent Publication, it is possible to easily form a capacitor within the alumina ceramic circuit board.

In this production method, as an amount of molybdenum powder and/or tungsten powder gradually increases, the relative dielectric constant of the resultant ceramic dielectric body also increases.

However, if the added amount of conductive substance exceeds 50% by weight, a resistance of the obtained ceramic body suddenly decreases to exhibit electrical conductivity.

Accordingly, in the method disclosed in the Patent Publication, it is possible to increase the mixed amount of a conductive substance by more than 50% by weight, whereby the relative dielectric constant of the resultant dielectric body is at most 17 or so.

On the other hand, there has been a great demand for a dielectric body having a higher dielectric constant in a circuit board of alumina ceramic or the like.

If the dielectric body having a higher dielectric constant could be formed by mixing the conductive substance in the dielectric substance, an effective means would be obtained for forming a capacitor having a high capacitance in the circuit board.

SUMMARY OF THE INVENTION

Thus, an object of the present invention is to provide a capacitor formed of a dielectric body having a high dielectric constant, obtained by the mixture of a dielectric substance and a conductive substance.

Inventors of the present invention studied to achieve the above object. As a result, a conductive ceramic body was molded by firing, at a predetermined temperature, a green sheet formed of alumina powder mixed with tungsten powder of 60% by weight. Then, a pair of electrodes were provided opposite to each other while interposing the molded ceramic body. It was found that the ceramic body is converted to a dielectric body by applying a high current or voltage in a pulsed manner to the electrodes. Thus, the present invention was completed.

That is, the present invention is a capacitor comprising a dielectric body interposed between a pair of electrodes disposed opposite to each other; said dielectric body being formed of a basic dielectric substance mixed with a conductive substance, characterized in that the dielectric body is one wherein conductive paths provided by the conductive substance mixed with the dielectric substance are electrically broken.

Also, the present invention is a method for producing a capacitor comprising a dielectric body composed of a basic dielectric substance mixed with a conductive substance, interposed between a pair of electrodes disposed opposite to each other, characterized in that the method comprises the following steps of:

after a conductive body has been formed by mixing the conductive substance with the dielectric substance, providing a pair of electrodes while interposing the conductive body therebetween, and intermittently applying an electric current or voltage to the electrodes, high enough to electrically break conductive paths formed in the conductive body by the conductive substance, so that the conductive body is converted to the dielectric body.

In addition, the present invention is a method for producing a dielectric body wherein a conductive substance is mixed with a basic conductive substance, comprising the steps of:

after a conductive body has been formed by mixing the conductive substance with the dielectric substance, interposing the conductive body between a pair of electrodes, and intermittently applying an electric current or voltage to the electrodes, high enough to electrically break conductive paths formed in the conductive body by the conductive substance, so that the conductive body is converted to the dielectric body.

According to the present invention having such a structure, it is possible to obtain a ceramic or plastic body exhibiting the conductivity by mixing a conductive substance exceeding 50% by weight or 15.9% by volume with a ceramic material exhibiting the dielectric property.

It is also possible to form a conductive body capable of being converted to a dielectric body in a circuit board of alumina ceramic at the same time that the circuit board of alumina ceramic is fired, by using, as ceramic material, alumina powder and, as a conductive substance, tungsten powder, tungsten oxide powder, molybdenum powder or molybdenum oxide powder.

According to the present invention, the conductive body is formed by mixing a large amount of a conductive substance with the dielectric substance. Conductive paths are formed within this conductive body.

Then, the conductive body is converted to the dielectric body by intermittently applying a high current or a high voltage to the electrodes while interposing the conductive substance between them to electrically break the conductive paths.

The dielectric body converted to the conductive body as mentioned above has a higher relative dielectric constant compared with that of a dielectric body formed by mixing therewith a conductive substance of an amount capable of substantially maintaining the insulating property of the dielectric body.

It is surmised that the reason therefor is that an extremely thin dielectric layer, compared with a dielectric layer in a dielectric body wherein a smaller amount of conductive substance is mixed with the dielectric substance, is formed on the surface of a particle of the conductive substance forming a conductive path.

Thus, according to the present invention, it is possible to obtain the dielectric body having a higher relative dielectric constant even though a dielectric substance having a lower relative dielectric constant is used.

A dielectric body forming a capacitor according to the present invention can be obtained by mixing a conductive substance with a dielectric substance.

Ceramic materials or organic insulating materials such as plastic or others may be used as the dielectric substance. Particularly, alumina powder, aluminum nitride powder or glass powder can be suitably used as the ceramic material.

The conductive substance suitably mixed with such dielectric substances is preferably selected while taking into account the relationship with the dielectric substance. For example, when a dielectric substance capable of forming a ceramic body through a high temperature firing is used, a ceramic material such as alumina powder, or a powder of a metal having a melting point in the vicinity of that of the ceramic material is favorably used, such as tungsten powder, tungsten oxide powder, molybdenum powder or molybdenum oxide powder.

On the other hand, when an organic insulating body such as plastic or glass powder is used as the dielectric substance, powder of Au, Cu or Ag is preferably used, which has a lower melting point than that of tungsten powder or the like but is excellent in the electrical conductivity.

BRIEF DESCRIPTION OF THE DRAWINGS

FIG. 7 is a graph representing the relationship between a frequency of the direct current, and the relative dielectric constant ($\epsilon$) and tan $\delta$ of the capacitor in another embodiment,

DESCRIPTION OF THE PREFERRED EMBODIMENTS

According to the present invention, it is important that the conductive substance of such an amount that the conductivity can be exhibited is mixed in the dielectric substance.

Figure 1A:
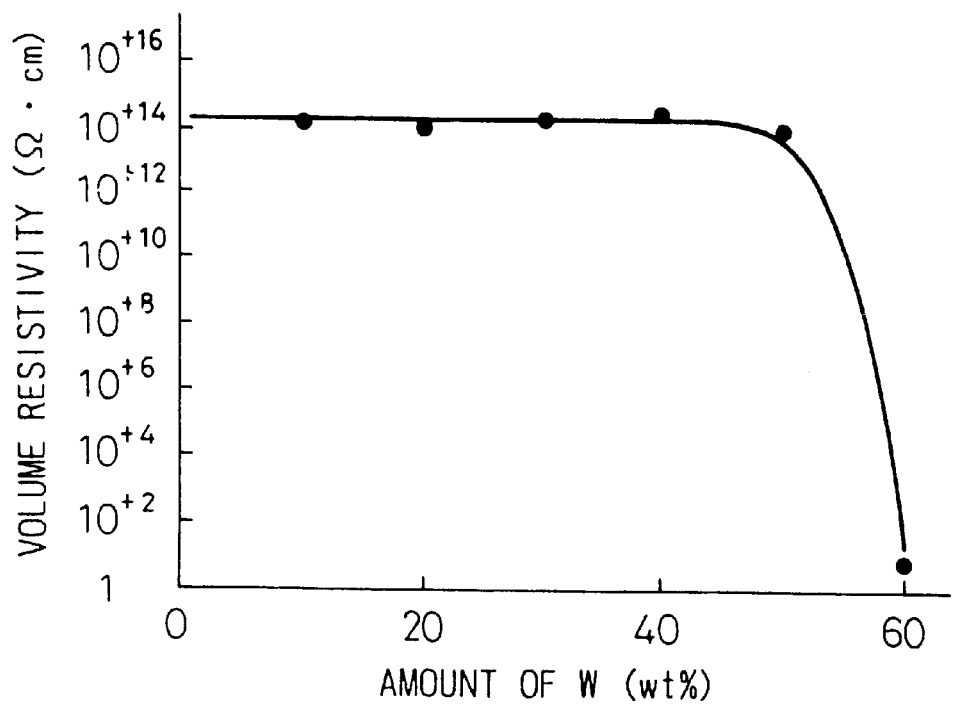
FIG. 1(a) is a graph showing the relationship between an amount of tungsten (W) to be mixed and the volume resistivity of the resultant ceramic body.

The relationship between the amount of the conductive substance and the resultant volume resistivity of the mixture is shown in FIG. 1(a). FIG. 1(a) is a graph representing the relationship between an amount of tungsten (W) powder used as a conductive substance to be mixed with alumina powder used as dielectric substance and the volume resistivity of the resultant alumina ceramic body obtained by firing a green sheet formed of the tungsten powder mixed with the alumina powder.

As present from FIG. 1(a), when an amount of the tungsten powder to be mixed with the alumina powder is 50% by weight or less, the resultant alumina ceramic body is a dielectric body exhibiting a high volume resistivity.

While, if an amount of the tungsten powder to be mixed with the alumina powder exceeds 50% by weight, the volume resistivity of the resultant alumina ceramic body is suddenly reduced. Particularly, when an amount of the tungsten powder to be mixed with the alumina powder is 55% by weight or more (especially 60% or more), the resultant alumina ceramic body is a conductive body exhibiting a good conductivity.

Figure 1B:
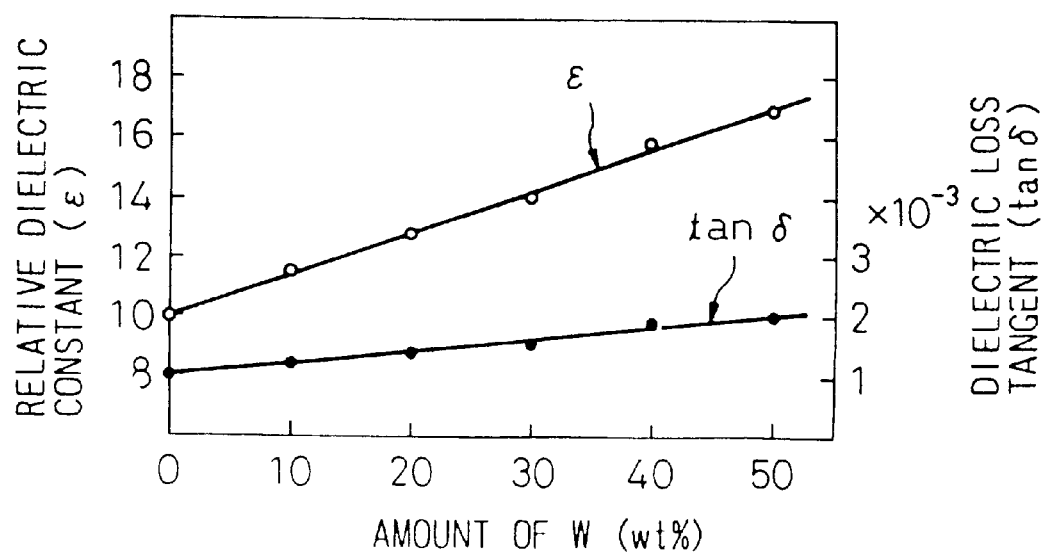
FIG. 1(b) is a graph representing the relationship between the amount of tungsten, and the relative dielectric constant ($\epsilon$) and the dielectric loss tangent (tan $\delta$) of the resultant alumina ceramic body.

FIG. 1(b) is a graph representing the relationship between the amount of tungsten (W) % by weight used as the conductive substance to be mixed with alumina ceramic powder used as dielectric substance, and the relative dielectric constant ($\epsilon$) of and the dielectric loss tangent ($\delta$) of the resultant alumina ceramic body obtained by firing a green sheet formed of the tungsten mixed with the alumina powder.

As can be seen from FIG. 1(b), when the amount of tungsten powder is increased, the relative dielectric constant ($\epsilon$) of the alumina ceramic body is increased. However, when the amount of tungsten powder exceeds 50% by weight, an electrical short circuit may possibly occur in this alumina ceramic body.. This means that the alumina ceramic body will be changed to a conductive substance from the insulation body when an amount of tungsten (W) exceeds that value. Also, during the intermediate region of the amount of tungsten from 15.9% by volume (50% by weight) to 22.1% by volume (60% by weight), i.e., the amount of alumina ceramic from 84.1% by volume (50% by weight) to 77.9% by volume (40 by weight), the difference between the conductive substance and the insulation body will be remarkably represented in the resultant alumina ceramic body.

Figure 2:
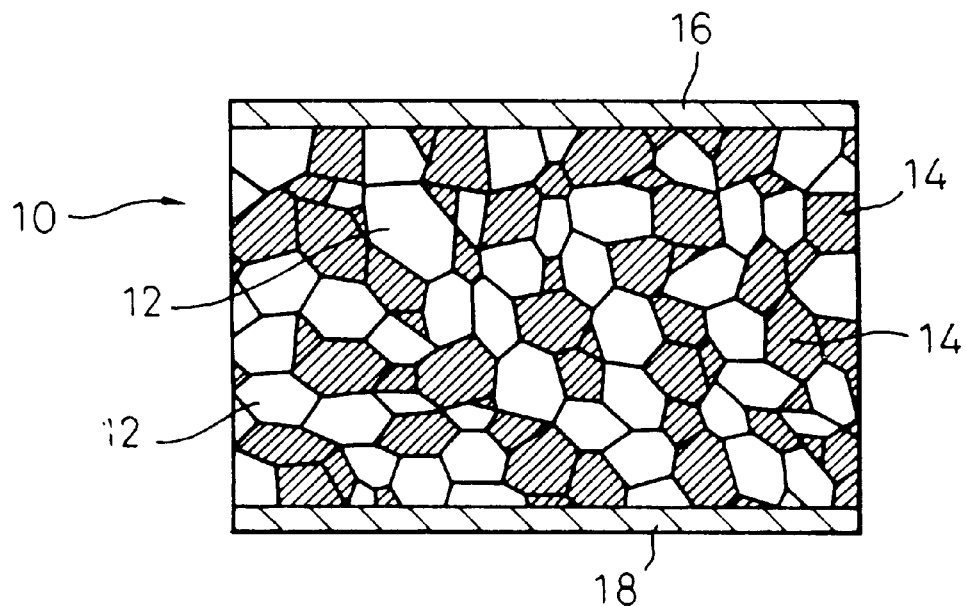
FIG. 2 is a side sectional view of the resultant conductive body.

As shown in FIG. 2, the ceramic body has conductive paths consisting of tungsten particles 14, in a dielectric substance forming the alumina-ceramic body 10 consisting of alumina particles 12, Thereby, the alumina ceramic body 10 exhibits the electrical conductivity.

Electrodes 16 and 18, shown in FIG. 2, are provided while interposing the alumina ceramic body 10 between them both and are formed of metalized layers which are obtained by firing tungsten paste or the like coated on the surface of a green sheet, which firing is carried out simultaneously with the firing of the green sheet to form the alumina ceramic body 10.

In this regard, instead of forming the electrodes 16 and 18 as the metalized layers, it is possible to provide the electrodes 16 and 18 by metallic layers after the alumina ceramic body 10 has been fired. Alternatively, metallic plates may themselves be used as electrodes 16 and 18.

According to the present invention, the conductive alumina ceramic body 10 can be converted to a dielectric body by electrically breaking conductive paths formed in the interior of the alumina ceramic body 10.

This electrical breakage of the conductive paths is carried out by intermittently applying a current or voltage to the electrodes 16 and 18, high enough to break the conductivity of the alumina ceramic body 10 exhibiting the conductivity.

The high current or voltage to be intermittently applied to the electrodes 16 and 18 can be generated by a spot welder generally used for the production of a semiconductor device or the like.

In this regard, the continuous application of the high current or voltage to the electrodes 16 and 18 is not favorable because of heat generation in the ceramic body 10. Particularly, if an organic insulating body such as plastic is used, voids may be formed due to partial melting of the organic insulating body.

It is preferable to preliminarily determine, through experiments, a magnitude of current or voltage to be applied in accordance with kinds, shapes, sizes, mixing ratios or others of the conductive substance to be mixed.

The alumina ceramic body 10, wherein the conductivity has been broken in such a manner, is capable of providing a capacitor having a larger capacitance, because it is converted to a dielectric body having a higher relative dielectric constant compared to that described in the above-described Patent Publication wherein a conductive substance of 50% by weight or less is mixed in a dielectric substance.

Also, it is possible to obtain a dielectric body having a high relative dielectric constant by using, as a dielectric substance, ceramic powder having a low relative dielectric constant.

Figure 3:
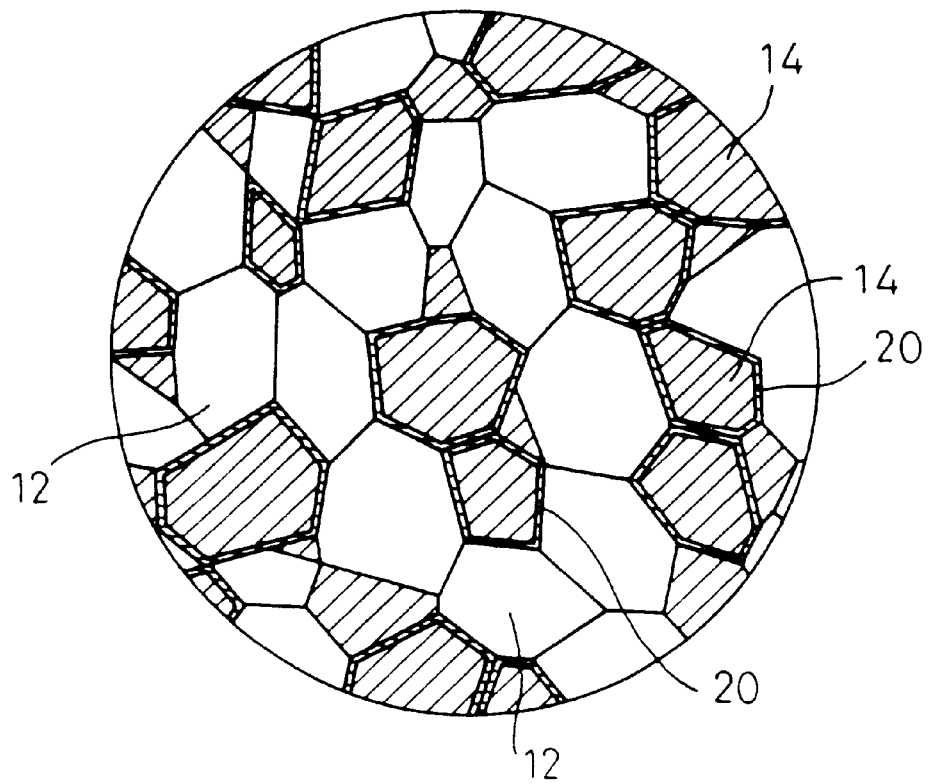
FIG. 3 is an illustration for explaining the internal structure of a dielectric body obtained by the intermittent application of a high current or voltage to electrodes disposed opposite to each other while interposing a conductive body between them.

It is surmised that the reason why such an alumina ceramic body 10 exhibits a high relative dielectric constant is that, when the high current or voltage is applied to tungsten particles 14, forming conductive paths, parts of the tungsten particles 14, forming the conductive paths sequentially fuse while remaining extremely thin dielectric layers 20, on boundary surfaces of the respective particles, as shown in FIG. 3.

The capacitor described above can be easily formed in a circuit board. For example, as shown in FIG. 4, a conductive ceramic layer 36, with which conductive substance of an amount enough to exhibit the conductivity is mixed is provided between ceramic layers 32 and 34 forming a circuit board 30.

The conductive ceramic layer 36 is sandwiched between conductive layers 38 and 40 which, in turn, are connected to electrodes 46 and 48 through via-holes 42 and 44, respectively.

If a current or voltage high enough to break the conductivity of the conductive paths formed in the conductive ceramic layer 36 is intermittently applied between the electrodes 46 and 48, a portion of the conductive ceramic layer 36 between the electrodes 46 and 48 is converted to a dielectric body having a high relative dielectric constant which provides a capacitor having a high capacitance in the circuit board 30.

Figure 4:
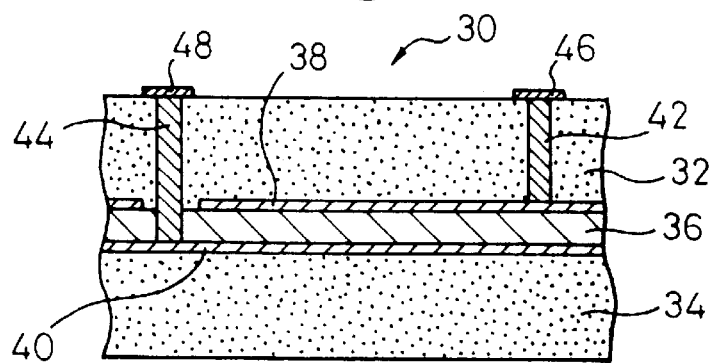
FIG. 4 is an illustration for explaining a method for forming a capacitor in a circuit board.

In FIG. 4, since the conductive ceramic layer 36 is sandwiched between the conductive layers 38 and 40, the smaller an area of the conductive layer 38 or 40 is, the narrower the portion of the conductive ceramic layer 36 forming the capacitors is. In such a manner, according to the present invention, it is possible to adjust the size of the capacitor.

Figure 5:
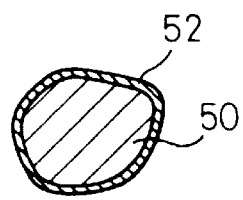
FIG. 5 is a cross-sectional view showing an example of conductive substance.

Although metallic powders such as tungsten powder, used as a conductive substance in the above description, it is also possible, as shown in FIG. 5, to use dielectric particles 50, such as alumina or glass, coated with a metallic layer 52 or with a metallic powder.

An example of the present invention will be described in more detail as follows.

EXAMPLE 1

(1) Production of a Conductive Body

A green sheet was prepared by a conventional method from ceramic powder containing alumina powder and a firing agent or others mixed with tungsten powder having a particle size of 1.1 μm of 60% by weight (relative to the ceramic powder).

Then, the green sheet was cut into plate-like pieces having a predetermined dimension. A tungsten paste was then coated on both sides of the plate-like piece.

Thereafter, the piece was fired at 1550° C. to form a rectangular ceramic body of 4 mm long, 4 mm wide and 0.65 mm thick, which has metalized layers on both sides thereof, as shown in FIG. 2. The ceramic body has the volume resistivity of $12 \times 10^{-3}$ Ω·cm and is an electrically conductive body.

(2) Conversion to a Dielectric Body

A direct current of 50 W/sec (DC 20 V) was applied once to electrodes of the resultant conductive body by a spot welder. By the application of DC current, the ceramic body was converted to a dielectric body having the volume resistivity of $1.2 \times 10^9$ Ω·cm.

Measurements of the volume resistivity were carried out while repeating the intermittent application of DC current of 50 W/sec (DC 20 V) one hundred times. The volume resistivity varied in a range between $1.2 \times 10^9$ Ω·cm and $1.6 \times 10^9$ Ω·cm.

Then, the apparent relative dielectric constant ($\epsilon$) was measured on a capacitor formed of a portion of the dielectric body thus obtained between the electrodes. The measured values were in a range between 400 through 500.

This relative dielectric constant ($\epsilon$) is much higher than that of the alumina forming the dielectric body. The apparent relative dielectric constant ($\epsilon$) of alumina is about 8 to 10.

Figure 6:
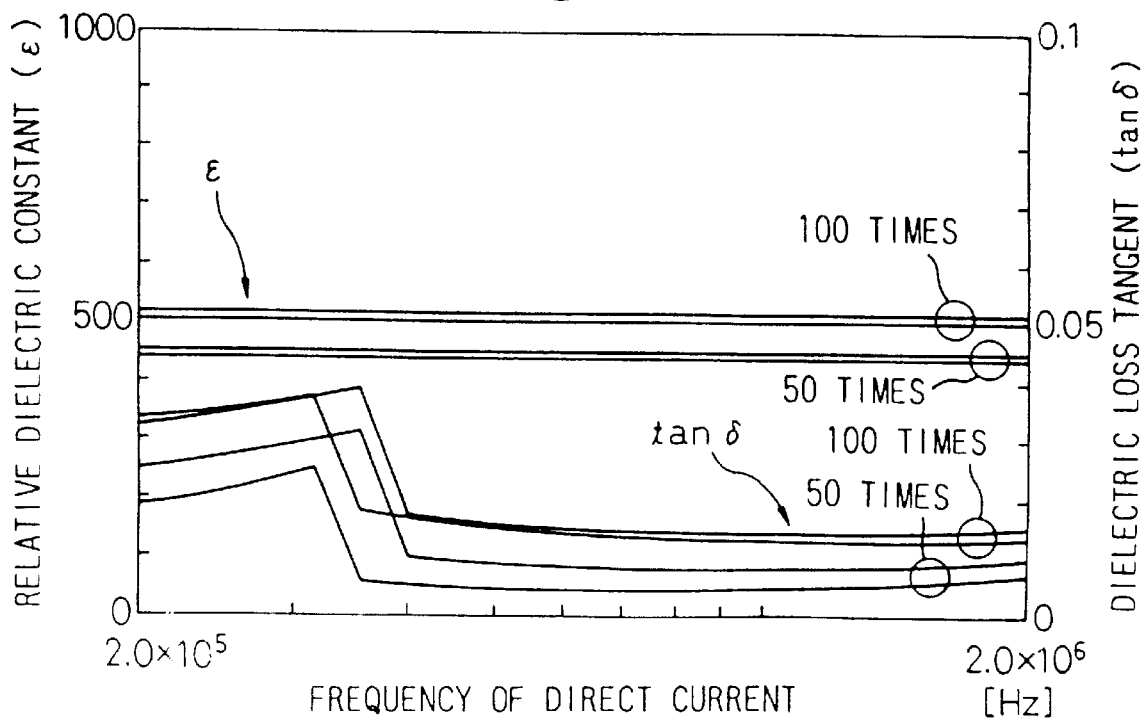
FIG. 6 is a graph representing the relationship between a frequency of the direct current applied to the ceramic body,.and the relative dielectric constant ($\epsilon$) and tan $\delta$ (dielectric loss tangent) of the resultant alumina ceramic body.

FIG. 6 is a graph representing the relationship between a frequency (Hz) of the direct current applied to the ceramic body and the relative dielectric constant ($\epsilon$) and the dielectric loss tangent (tan $\delta$) of the resultant alumina ceramic body. In the experiment a DC current of 50 W/sec (DC 20 V) was applied to the resultant alumina ceramic body one hundred times and fifty times, respectively, and such an experiment was measured twice. This graph shows that the alumina ceramic body obtained in accordance with the present invention has favorable characteristics as a capacitor.

EXAMPLE 2

A capacitor was obtained in the same manner as Example 1, except that an epoxy resin (ECON-1045, Nihonkayaku, Kabushiki Kaisha), having a softening point of 90° C. and dielectric constant ($\epsilon$) of about 4, was used as a dielectric material and copper (Cu) powder was used as a conductive material. Thus, the Cu powder and the epoxy resin were mixed in a water bath as known in the prior art.

FIG. 7 is a graph representing the relationship between the frequency (Hz) of the direct current applied to the resultant capacitor obtained in Example 2 and the relative dielectric constant ($\epsilon$) and the dielectric loss tangent (tan $\delta$) thereof. In the experiment a DC current of 50 W/sec (DC 20 V) was applied to the resultant capacitor one hundred times. The other conditions were the same as the above-mentioned Example 1. FIG. 7 shows that the capacitor obtained from epoxy resin mixed with Cu powder in accordance with Example 2 also has favorable characteristics as a capacitor.

Comparative Example

A ceramic body was obtained in the same manner as in Example 1, except that an added amount of tungsten powder is 50% by weight. The resultant ceramic body was a dielectric body having the volume resistivity of $1.0 \times 10^{14}$ $\Omega \cdot cm$.

Accordingly, without the application of DC current by a spot welder, the apparent relative dielectric constant ($\epsilon$) of this dielectric body was measured, as about 17.

According to the present invention, since a dielectric body is obtained having a higher relative dielectric constant than that of a dielectric substance used therefor, it is possible to form a high capacitance capacitor within a circuit board without changing kinds, molding conditions or others of a dielectric substance conventionally used.

What is claimed is:

1. A capacitor comprising:
   a pair of electrodes disposed opposite to each other; and
   a dielectric body interposed between said pair of electrodes, said dielectric body being formed of a dielectric substance mixed with a conductive substance, wherein conductive paths, provided by the conductive substance being mixed with the dielectric substance, are electrically broken.

2. A capacitor as defined by claim 1, wherein said dielectric body is a ceramic body and the conductive substance is mixed with a ceramic component composed of the dielectric substance, at a ratio exceeding one of 50% by weight and 15.9% by volume.

3. A capacitor as defined by claim 2, wherein the ceramic body is alumina ceramic and the conductive substance is selected from the group consisting of tungsten powder, tungsten oxide powder, molybdenum powder and molybdenum oxide powder.

4. A capacitor as defined by claim 1, wherein said dielectric body is a plastic body and the conductive substance is mixed with a resin component composed of the dielectric substance at a ratio exceeding one of 50% by weight and 15.9% by volume.

5. A capacitor as defined by claim 4, wherein the conductive substance is selected from the group consisting of Au, Cu and Ag.

6. A capacitor comprising:
   a dielectric body formed by a mixture of a dielectric substance and a conductive substance, wherein conductive paths formed by the conductive substance are electrically broken.

* * * * *

UNITED STATES PATENT AND TRADEMARK OFFICE
CERTIFICATE OF CORRECTION

PATENT NO. : 6,201,684 B1
DATED : March 13, 2001
INVENTOR(S) : Tsuyoshi Kobayashi et al.

It is certified that error appears in the above-identified patent and that said Letters Patent is hereby corrected as shown below:

Title page,
Item (54), delete ",".

Column 2,
Lines 41-42, delete in its entirety.
Lines 44, after "electrodes," insert -- after a conductive body has been formed by mixing the conductive substance with the dielectric substance --.

Column 4,
Line 4, and Line 59, change "," to -- . --;
Line 20, change "present form" to -- as shown --;
Line 45, delete "." (sencond occurrence);
Line 57, delete ",".

Column 5,
Line 43, and Line 44, delete ",";
Line 46, delete "," (first occurrence );
Line 50, after "which" insert -- a --;
Line 51, after "mixed" insert -- , --.

Column 6,
Line 6, after "powders" insert -- , --;
Line 6, before "used" insert -- are --;
Line 62, after "experiment" insert -- , --.

UNITED STATES PATENT AND TRADEMARK OFFICE
CERTIFICATE OF CORRECTION

PATENT NO. : 6,201,684 B1
DATED : March 13, 2001
INVENTOR(S) : Tsuyoshi Kobayashi et al.

It is certified that error appears in the above-identified patent and that said Letters Patent is hereby corrected as shown below:

Column 7,
Line 14, after "experiment" insert -- , --;
Line 30, delete ",".

Signed and Sealed this

Fourth Day of September, 2001

*Attest:*

NICHOLAS P. GODICI
*Attesting Officer*    *Acting Director of the United States Patent and Trademark Office*